United States Patent [19]

Parkes

[11] Patent Number: 5,396,625
[45] Date of Patent: Mar. 7, 1995

[54] SYSTEM FOR BINARY TREE SEARCHED VECTOR QUANTIZATION DATA COMPRESSION PROCESSING EACH TREE NODE CONTAINING ONE VECTOR AND ONE SCALAR TO COMPARE WITH AN INPUT VECTOR

[75] Inventor: Stephen M. Parkes, Bristol, United Kingdom

[73] Assignee: British Aerospace Public Ltd., Co., London, United Kingdom

[21] Appl. No.: 221,444

[22] Filed: Apr. 1, 1994

Related U.S. Application Data

[63] Continuation of Ser. No. 737,309, Jul. 31, 1991, abandoned.

[30] Foreign Application Priority Data

Aug. 10, 1990 [GB] United Kingdom ............... 90176009

[51] Int. Cl.[6] .................... G06F 7/4; G06F 15/347
[52] U.S. Cl. ..................... 395/600; 364/260.6; 364/251.6; 364/951.3; 364/DIG. 1; 341/79; 341/200; 381/35
[58] Field of Search ............ 395/600; 341/79, 200; 381/35

[56] References Cited

U.S. PATENT DOCUMENTS

| 4,670,851 | 6/1987 | Murakami | 364/518 |
| 4,710,812 | 12/1987 | Murakami et al. | 348/417 |
| 4,727,354 | 2/1988 | Lindsay | 340/347 |
| 4,849,810 | 7/1989 | Ericcsson | 358/133 |
| 5,010,574 | 4/1991 | Wang | 395/1.31 |
| 5,021,971 | 6/1991 | Lindsay | 364/513.5 |

FOREIGN PATENT DOCUMENTS 0403154 12/1990 European Pat. Off. .

OTHER PUBLICATIONS

Chaur et al., "A Codebook Design Algorithm for Vector Quantization of Images", IEEE Region 10 Conference On Computer and Communication Systems, Sep. 1990, H. K., pp. 459-463.
Chang et al., "An Economical Binary Tree Structure for Vector Quantization" 1991 IEEE.
Patent Abstracts of Japan, vol. 14, No. 166 (E-911) Mar. 1990 & JP A 2-0021727 01/1990.
N. M. Nasrabadi, et al., "Image Coding Using Vector Quantization: A Review", IEEE Transactions on Communications, vol. 36, No. 8, Aug. 1988, pp. 957-971.

*Primary Examiner*—Thomas C. Lee
*Assistant Examiner*—Jack M. Choules
*Attorney, Agent, or Firm*—Cushman Darby & Cushman

[57] ABSTRACT

Data compression processing is carried out using binary Tree-Searched Vector Quantization in which the direction of branching at each node of the tree is decided by comparison of an input vector (6) with a single code vector (B(n)) and an associated Scalar value (A).

23 Claims, 2 Drawing Sheets

SYS CONFIG

SYSTEM FOR BINARY TREE SEARCHED VECTOR QUANTIZATION DATA COMPRESSION PROCESSING EACH TREE NODE CONTAINING ONE VECTOR AND ONE SCALAR TO COMPARE WITH AN INPUT VECTOR

This is a continuation of application No. 07/737,309, filed on Jul. 31, 1991, which was abandoned upon the filing hereof.

BACKGROUND OF THE INVENTION

This invention relates to an assembly and method for binary Tree-Searched Vector Quantization (TSVQ) data compassion processing.

FIELD OF THE INVENTION

Vector Quantization (VQ) is a technique for data compression (encoding). Binary Tree-Searched Vector Quantization (TSVQ) is a particular form of VQ in which each input vector is compared to two vectors in a codebook to determine the direction of branching at each node of the tree.

Vector Quantization (VQ) is a well known conventional data compression technique. This will now be described with reference to the accompanying drawings, in which:

FIG. 1 is a block diagram of the basic structure of a conventional full-search vector quantizer, and FIG. 2 is a diagram illustrating a conventional binary tree-searched vector quantizer.

As shown in FIG. 1 a number of image samples are grouped first to form an input vector Xn. A VQ encoder 1 then compares with this vector Xn to entries in a codebook Memory 2, which is available to both encoder 1 and decoder 3. The codebook 2 is searched to find the closest match to the source vector. The index of the closest match vector Un is transmitted to the decoder 3 (see FIG. 1) to produce a reconstructed Vector Zn. The decoder 3 simply looks up the closest match vector in the codebook 2 using the transmitted index Un. This method of vector quantization is known as full search VQ. For a compression of B bits per sample and N samples in the vector, a codebook of $2^{BN}$ vectors is required. A full search VQ requires $2^{BN}$ vector comparisons.

Vector codebooks may be produced by generating an initial codebook and then optimising its performance on a training sequence of data representative of the type of data on which the vector quantizer is to be used.

Alternatively, the codebook can be generated by first finding the centroid of the training sequence. The centroid is effectively a single vector which optimally represents the entire training sequence. This vector is split into two by applying a small perturbation to produce the second vector. These two vectors are optimised using the full training sequence, giving two code vectors which optimally describe the training sequence. Each of these code vectors is split to produce a total of four code vectors, which are again optimised using the training sequence. The process of code vector splitting and optimisation is repeated until a codebook of the required size has been created. This method of codebook generation is known as the splitting technique.

Various modifications to the basic VQ technique are possible which improve the computational and/or memory requirements of the full search technique.

One of these is the binary Tree Searched Vector Quantization (TSVQ). TSVQ arises naturally from the splitting method of codebook generation. Conventionally a sample vector is compared to two codebook vectors (those that were generated after splitting and optimising the initial training sequence centroid). Depending on the outcome, one of two branches of the encoding tree are taken (see FIG. 2). The sample vector is then compared to a further pair of codebook vectors at the next node of the tree. These code vectors are those that were generated in the second level of codebook generation. Again, one of two branches of the encoding tree are taken. This process continues until the bottom level of the tree is reached where the code vector index is transmitted.

Tree-searched VQ is more effective than full-search VQ. It requires fewer vector comparisons, that is BN vector comparisons compared to $2^{BN}$ for the full search method. However, the tree-searched VQ is non-optimal and can only be applied to appropriately structured codebooks. Additionally the conventional tree searched vector quantization still requires a relatively large amount of processing power, some six comparison operations at each node stage. Tree-searched VQ also requires a larger vector codebook memory than conventional full-search VQ.

OBJECTS OF THE INVENTION

It is an object of the present invention to provide a generally improved method and assembly for binary Tree-searched Vector Quantization data compression processing which preferably requires less processing power and/or requires less memory capacity than conventional binary Tree-Searched Vector Quantization techniques.

This and other objects and advantages of the present invention will become more apparent from details disclosed in the following specification where preferred embodiments of the invention are described.

SUMMARY OF THE PRESENT INVENTION

According to one aspect of the present invention there is provided a binary Tree-Searched Vector Quantization data compression processing assembly comprising a vector memory, for receiving and storing input samples forming an input vector; a vector codebook memory, for holding entries each in the form of a single code vector and an associated scalar value, and comparing means, for comparing the input vector with said single code vector and associated scalar value to decide the direction of branching at each node of the tree.

Preferably the comparing means is a computation unit operable to add the inner product of a source vector with the code vector, at a particular node, to the associated scalar value for that node and then test the result, taking one branch of the tree if the result is negative and the other branch of the tree if it is positive or zero.

Alternatively the comparing means is a computation unit operable to add the scalar value, of a particular node, to the inner product of a source vector with the code vector, for that node and then test the result, taking one branch of the tree if the result is negative and the other branch of the tree if it is positive or zero.

As a further alternative the comparing means is a computation unit operable to calculate the inner product of a source vector with the code vector, at a particular node and then compare the result with the scalar value for that node, taking one branch of the tree if the scalar value is greater than the inner product and the other branch of the tree if the scalar value is the same or less than the inner product.

Conveniently the comparing means comprises a computation unit in the form of a single multiplier-accumulator unit.

Alternatively the comparing means comprises a computation unit in the form of a plurality of multiplier-accumulator units.

Advantageously the comparing means comprises a computation unit in the form of a systolic array processor or a wave front array processor.

Preferably the vector memory is a banked memory operable so that a new input vector can be loaded while the previous input vector is being processed.

Conveniently the vector codebook memory is selected from a group comprising a Random Access Memory (RAM) or a Read Only Memory (ROM).

Advantageously the assembly includes a sample counter for accessing the input samples in the vector memory and for accessing elements of the code vector in the vector codebook memory.

Preferably the assembly includes a level counter for accessing the relevant areas of the vector codebook memory which correspond to the different levels of the Tree-Searched Vector Quantization.

Conveniently the assembly includes a code index register for holding a current value of a code index as it is being computed by the means for comparing input vectors, and codebook vectors, and to direct access to appropriate code vectors in the codebook memory.

The assembly may also include a system controller for directing the operation of the assembly.

A further object of the present invention is to provide a method of data compression processing using binary Tree-Searched Vector Quantization comprising the step of deciding the direction of branching at each node of the tree by comparing an input vector with a single code vector and an associated scalar value.

For a better understanding of the present invention and to show how the same may be carried into effect, reference will now be made, by way of example, to the accompanying drawings, in which:

DETAILED DESCRIPTION OF THE PRESENT INVENTION

Figure 1:
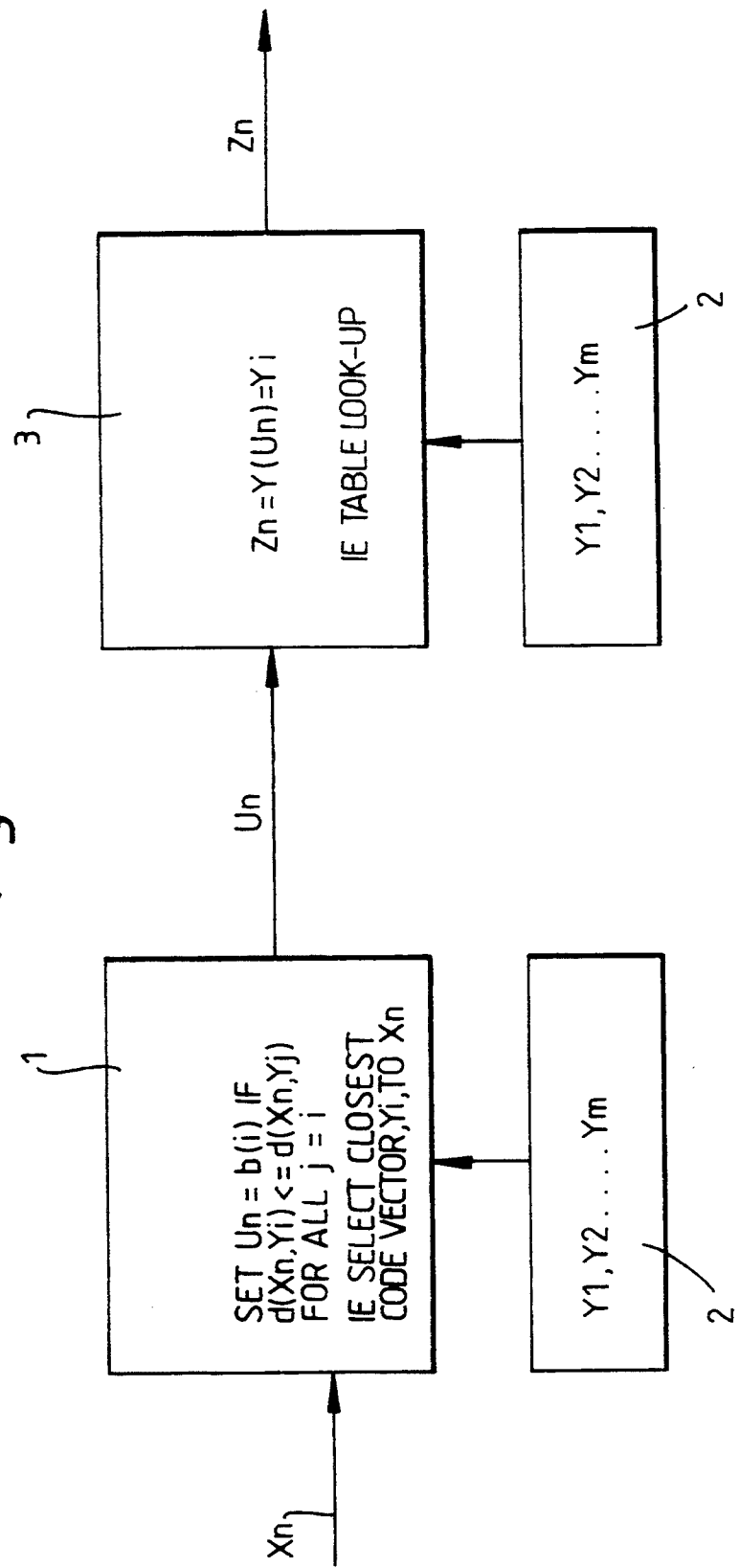
FIG. 1 is a block diagram of the basic structure of a conventional full search quantizer.

With reference to the accompanying drawings, consider a conventional tree-searched vector quantizer which has N samples per vector and a codebook size of $2^{BN}$ where B is the number of bits per sample. There are BN stages required for the corresponding tree-searched vector quantizer. At each stage the input vector must be compared to the possible code vectors to determine which branch of the tree to follow in deriving the final code vector index. So, a total of 2.BN vector comparisons are required.

A vector comparison is normally a sum of squares of differences, given by $$\sum_{n=0}^{N-1} (c(n) - s(n))^2 \qquad (1)$$

where $c(n)$ is a codebook vector and $s(n)$ is the input vector. At each stage the problem is to determine which of two code vectors most closely matches the input vector. If $c_1(n)$ is one code vector and $c_2(n)$ is the other, then $c_1(n)$ is the chosen vector if $$\sum_{n=0}^{N-1} (c_1(n) - s(n))^2 < \sum_{n=0}^{N-1} (c_2(n) - s(n))^2 \qquad (2)$$

To evaluate relationship (2) directly requires 2N subtractions, 2N multiplications, 2(N−1) additions and one comparison. A total of approximately 6N operations per vector per stage of the TSVQ. That is equivalent to 6BN operations per sample for the entire TSVQ.

Rearranging relationship (2) produces $$\sum_{n=0}^{N-1} (c_1(n) - s(n))^2 - \sum_{n=0}^{N-1} (c_2(n) - s(n))^2 < 0 \qquad (3)$$

which can be expanded to $$\sum_{n=0}^{N-1} [c_1^2(n) - 2c_1(n)s(n) + \qquad (4)$$

$$s^2(n) - c_2^2(n) + 2c_2(n)s(n) - s^2(n)] < 0$$

and $$\sum_{n=0}^{N-1} c_1^2(n) - c_2^2(n) + \sum_{n=0}^{N-1} s(n) \cdot 2[c_2(n) - c_1(n)] < 0 \qquad (5)$$

Now $$\sum_{n=0}^{N-1} c_1^2(n) - c_2^2(n) = A \qquad (6)$$

Where A is a constant (scalar value) for any given pair of code vectors, i.e. any node of the TSVQ. Also the code vector difference $c_2(n) - c_1(n)$ may be replaced by another vector $$b(n) = 2[c_2(n) - c_1(n)] \qquad (7)$$

Substituting relationships (6) and (7) in relationship (5) produces the comparison $$A + \sum_{n=0}^{N-1} s(n) \cdot b(n) < 0 \qquad (8)$$

Figure 3:
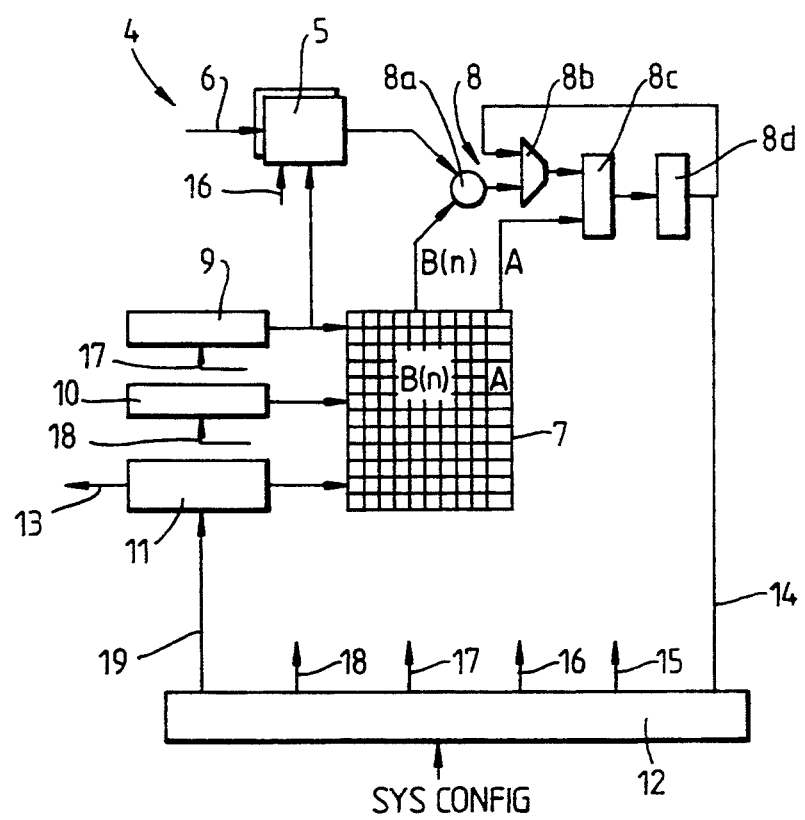
FIG. 3 is a block diagram of a binary Tree-Searched Vector Quantization data compression processing assembly according to a first embodiment of the present invention.

The binary Tree-Searched Vector Quantization data compression processing assembly of the present invention, generally referenced at 4 in FIG. 3 of the accompanying drawings is basically an encoder having a vector memory 5 for receiving and storing input samples 6 forming an input vector, a vector codebook memory 7 (preferably a Random Access Memory) for holding entries each in the form of a single code vector B(n) and an associated scalar value A, and means for comparing the input vector 6 with said single code vector B(n) and scalar value A to decide the direction of branching at each node of the tree.

Thus in the Tree-searched Vector Quantization (TSVQ) encoder or assembly 4 the two conventional code vectors ($c_1(n)$ and $c_2(n)$) at each node are replaced by one code vector (e.g. $B(n)=2[c_2(n)-c_1(n)]$) and a scalar value (e.g.

$$A = \sum_{n=0}^{N-1} c_1^2(n) - c_2^2(n)).$$

This means that with the method of the invention the direction of branching at each node of the tree is decided by comparison of an input vector with a single code vector and an associated scalar value.

Figure 2:
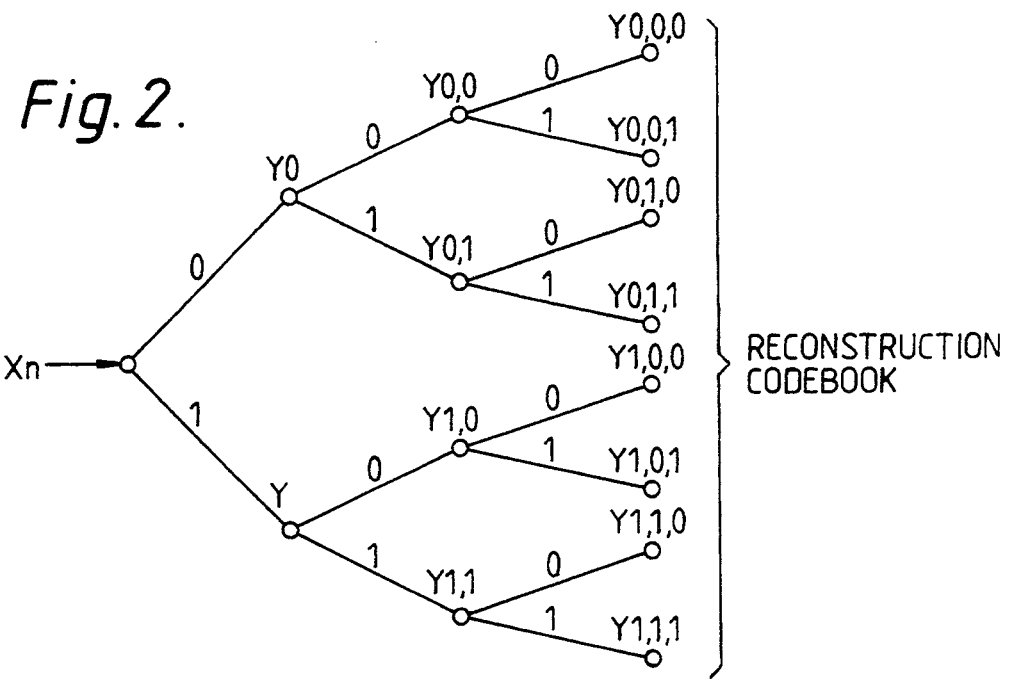
FIG. 2 is a diagram illustrating a conventional binary tree searched vector quantizer.

The comparing means preferably is a computation unit (8) operable to add the inner product (also known as the dot product) of a source vector with the codebook vector $B(n)$, at a particular node, to the scalar value for that node (i.e.

$$A + \sum_{n=0}^{N-1} s(n) \cdot B(n)))$$

and then test the result, taking one branch of the tree (as in FIG. 2) if the result is negative and the other branch of the tree if it is positive or zero.

The inner product is given by the sum of products $$A \cdot B = a_1 b_1 + a_2 b_2 + \cdots + a_n b_n$$

where $a_1, a_2, ---, a_n$ are the samples of vector A and $b_1, b_2, ---, b_n$ are the samples of vector B.

Alternatively the comparing means may be a computation unit operable to add the scalar value, of a particular node, to the inner product of a source vector with the codebook vector $B(n)$, for that node (i.e.

$$\left[\sum_{n=0}^{N-1} s(n) \cdot B(n)\right] + A)$$

and then test the result, taking one branch of the tree if the result is negative and the other branch of the tree if it is positive or zero.

In yet another alternative the comparing means is a computation unit operable to calculate the inner product of the source vector with the codebook vector $B(n)$, at a particular node (i.e.

$$\sum_{n=0}^{N-1} s(n) \cdot B(n))$$

and then compare the result with the scalar value, A, for that node, taking one branch of the tree if A is greater than the inner product and the other branch of the tree if it is the same or less than the inner product.

The computation unit preferably is a single multiplier-accumulator unit generally indicated at 8.

Alternatively the computation unit may be a plurality of such multiplier-accumulator units 8, a systolic array processor or a wavefront array processor.

With the assembly 1 of the invention the comparison $$A + \sum_{n=0}^{N-1} s(n) \cdot b(n) < 0 \quad (8)$$

may be achieved using the multiplier-accumulator unit 8 structure, having a multiplier 8a and an accumulator, which comprises an adder 8b, a selector 8c and a register 8d, by first pre-loading the accumulator register 8d with A and then accumulating into it the sum of $s(n).b(n)$ over the entire N samples of the vector, that is the inner product of the source vector $S(n)$ and the codebook vector $b(n)$. The sign-bit of the accumulator is then tested to see if the result is negative (<0) in which case the TSVQ branch corresponding to code vector $c_1(n)$ is chosen.

Each node of the TSVQ now requires N multiplications and N additions, that is 2N operations—one third of the 6N operations required for the direct TSVQ implementation. This corresponds to N multiply-accumulate operations per vector which is equivalent to BN multiply-accumulate operations per sample. It should also be noted that the storage space or memory 7 required for the codebook has been reduced.

With the assembly 1 the input samples 6 forming a vector are placed in the vector memory 5. The vector memory 5 may be a banked memory so that a new vector may be loaded while the previous vector is being processed. The vector codebook member 7 preferably is a RAM but may be a Read Only Memory (ROM). Each entry in the codebook comprises the scalar constant A and the vector $B(n)$.

The elements of the vector $B(n)$ are accessed by a sample counter 9 which also accesses the samples in the vector memory 5. A level counter 10 is used to access the relevant areas of the codebook which correspond to the different levels of the TSVQ and a code index register 11 is used to hold the current value of the code index (as it is being computed by the TSVQ) which is also used to direct access of the appropriate code vectors in the code book.

Alternatively, the level counter and code index register may be combined as one address generator.

The multiplier-accumulator has preload via the selector 8c. A system controller 12 forms the remaining part of the TSVQ processing element.

The system controller 12 directs the operation of the assembly 4. Once a new vector has been loaded into the vector memory 5 the code index register 11, sample counter 9 and level counter 10 are reset so that the root vector of the codebook is addressed. The corresponding constant A value is loaded into the accumulator register 8d. Then the sample counter 9 accesses each vector sample and codebook vector element $B(n)$ in turn. These are multiplied together by the multiplier 8a and accumulated by the accumulator components 8b, 8c and 8d. When the last sample of the vector is reached the sign-bit 14 of the accumulator register 8d is checked by the system controller 12 and the code index register 11 adjusted accordingly. The sample counter 9 is reset, the level counter 10 is incremented and the entire vector multiply-accumulate operation repeated, this time for the selected second level node. Operation continues in this way until all levels of the TSVQ have been traversed. The code index output 13 is then read out of the code index register 11 and the next sample vector 6 processed.

The system controller 12 includes facilities for sign bit 14, multiplier/accumulator control 15, Vector Memory control 16, sample counter control 17, level counter control 18 and Code Index Control 19.

Various modifications and alterations may be made to the embodiments of the present invention described and illustrated, within the scope of the present invention as defined in the following claims.

What is claimed is:

1. A binary Tree-Searched Vector Quantization data compression processing assembly comprising:
   a vector memory, for receiving and storing input samples forming an input vector;
   a vector codebook memory, storing a plurality of entries, one of said entries for each of a plurality of nodes of a vector search tree, each of said nodes representing a branch point at which different directions, towards different nodes, are possible, each of said entries associated with a particular node and including a single quantized code vector of the same dimensionality as said input vector, and an associated single valued scalar;
   a memory indexing element storing an address of a current node, addressing said vector codebook memory with said address, to obtain said single code vector and said associated single valued scalar for the current node; and
   a computation unit, including comparing means for comparing the input vector with said single code vector for the current node and with said associated single valued scalar for the current node to determine a direction of branching at each node of the tree.

2. An assembly according to claim 1, in which the computation unit performs a calculation including adding an inner product of a source vector with the code vector, at a particular node, to the associated scalar value for that node and then testing the result, taking one branch of the tree if the calculation results in a negative value and an other branch of the tree if the calculation results in a positive value or zero.

3. An assembly according to claim 1, in which the computation unit performs a calculation including adding the scalar value, of a particular node, to an inner product of a source vector with the code vector, for that node and then testing the result, taking one branch of the tree if the calculation results in a negative value and the other branch of the tree if the calculation results in a positive value or zero.

4. An assembly according to claim 1, in which the computation unit is for calculating the inner product of a source vector with the code vector, at a particular node and then comparing the inner product with the scalar value for that node, taking one branch of the tree if the scalar value is greater than the inner product and the other branch of the tree if the scalar value is less than or equal to the inner product.

5. An assembly according to claim 1 in which the computation unit is in the form of a single multiplier-accumulator unit.

6. An assembly according to claim 1 in which the computation unit includes a plurality of multiplier-accumulator units.

7. An assembly according to claim 1 in which the computation unit includes a systolic array processor.

8. An assembly according to claim 1 in which the computation unit includes a wavefront array processor.

9. An assembly according to claim 1 in which the vector memory is a banked memory operable so that a new input vector can be loaded while a previous input vector is being processed.

10. An assembly according to claim 1 in which the vector codebook memory is selected from a group comprising a Random Access Memory (RAM) and a Read Only Memory (ROM).

11. An assembly according to claim 1 further comprising a sample counter for accessing the input samples in the Vector memory and for accessing elements of the code vector in the vector codebook memory.

12. An assembly according to claim i further comprising a level counter for accessing relevant areas of the Vector codebook memory which correspond to different levels of the Tree-Searched Vector Quantization.

13. An assembly according to claim 1 further comprising a code index register for holding a current value of code index as it is being computed by the comparing means for comparing input vectors and codebook vectors, and to direct access to appropriate code vectors in the codebook memory.

14. A method of searching using Tree-Searched Vector Quantization data comprising the steps of:
   receiving and storing input samples forming an input vector;
   holding entries for each of a plurality of nodes of a search tree in a codebook vector memory, each entry including a single quantised code vector and an associated single valued scalar;
   extracting from said codebook vector memory a single code vector and an associated single valued scalar for a root node of the tree;
   comparing the input vector with the single code vector for the root node and with the associated single valued scalar;
   choosing a direction of branching from the node vector for the root node based on results of the comparing step, to find another node of the tree;
   retrieving another code vector and another associated single valued scalar for said another node from said codebook vector memory;
   comparing the input vector with said another single code vector and with said another associated single valued scalar for said another node;
   using results of said comparing for said another node to determine a direction of branching said another node of the tree; and
   repeating said retrieving, comparing, and using steps until the input vector has been coded.

15. A method as in claim 14 wherein said comparing steps for each node of the tree uses only one vector comparison and one scalar comparison.

16. A method as in claim 14 wherein said comparing steps include the steps of comparing the input vector against a node vector using a vector distance metric to produce a scalar result and comparing the scalar result of the vector comparison to the node scalar.

17. A method as in claim 15 wherein said comparing steps include the steps of comparing the input vector against a node vector using a vector distance metric to produce a scalar result and comparing the scalar result of the vector comparison to the node scalar.

18. A binary Tree-Searched Vector Quantization data compression processing assembly comprising:
   a vector memory, for receiving and storing input samples forming an input vector;
   a vector codebook memory, for storing a plurality of entries, each of said entries associated with a particular node of a search tree and including a single quantised code vector and an associated single valued scalar,
   a memory indexing element, storing an address of a current node, and addressing said vector codebook memory with said address, to obtain said single code vector and associated single valued scalar for the current node; and a computation unit, carrying out first computation which compare the input vector with said single code vector and carrying out second computation which compare said associated single valued scalar to another scalar value derived from a comparison of the input vector with said single code vector, to determine a direction of branching at each node of the tree.

19. An assembly according to claim 18, in which the computation unit is for adding a vector distance calculation between the input vector and the single code vector, at a particular node, to the associated scalar value for that node to produce a result and then testing the result, taking one branch of the tree if the result is negative and an other branch of the tree if the result is positive or zero.

20. An assembly according to claim 18, in which the computation unit is for adding the scalar value, of a particular node, to the inner product of a source vector with the code vector, for that node to produce a result and then testing the result, taking one branch of the tree if the result is negative and an other branch of the tree if the result is positive or zero.

21. An assembly according to claim 18, in which the computation unit is for adding the inner product of a source vector with the code vector, at a particular node and then comparing the result with the scalar value for that node, taking one branch of the tree if the scalar value is greater than the inner product and an other branch of the tree if the scalar value is the same or less than the inner product.

22. An assembly according to claim 18 in which the computation unit is in the form of a single multiplier-accumulator unit.

23. An assembly as in claim 18, wherein said another scalar value is a result of said first computation.

* * * * *